(12) United States Patent
Chang et al.

(10) Patent No.: US 11,923,302 B2
(45) Date of Patent: Mar. 5, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Fong-Yuan Chang, Hsinchu (TW); Noor Mohamed Ettuveettil, Hsinchu (TW); Po-Hsiang Huang, Tainan (TW); Sen-Bor Jan, Tainan (TW); Ming-Fa Chen, Taichung (TW); Chin-Chou Liu, Xinfeng Township (TW); Yi-Kan Cheng, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/854,683

(22) Filed: Jun. 30, 2022

(65) Prior Publication Data

US 2022/0336356 A1 Oct. 20, 2022

Related U.S. Application Data

(62) Division of application No. 16/573,630, filed on Sep. 17, 2019, now Pat. No. 11,410,929.

(51) Int. Cl.
*H01L 23/528* (2006.01)
*H01L 23/522* (2006.01)
*H01L 23/00* (2006.01)

(52) U.S. Cl.
CPC ...... *H01L 23/5286* (2013.01); *H01L 23/5226* (2013.01); *H01L 24/09* (2013.01);
(Continued)

(58) Field of Classification Search
CPC . H01L 23/5286; H01L 23/5226; H01L 24/09; H01L 21/76807; H01L 23/481; H01L 24/06; H01L 24/08; H01L 24/80; H01L 2224/05554; H01L 2224/05647; H01L 2224/0613; H01L 2224/06133; H01L 2224/80011; H01L 2224/80013; H01L 2224/80203; H01L 2224/80805; H01L 2224/80815; H01L 2224/80895; H01L 2224/80896; H01L 23/5283;
(Continued)

(56) References Cited

U.S. PATENT DOCUMENTS 5,363,550 A * 11/1994 Aitken .................. H01P 3/06
29/846
7,514,789 B1 4/2009 Tao et al.
2003/0038377 A1 2/2003 Nakata et al.
2004/0201062 A1 10/2004 Hirose et al.
(Continued)

FOREIGN PATENT DOCUMENTS

| CN | 102956587 A | 3/2013 |
| TW | 201533868 A | 9/2015 |
| TW | 201926408 A | 7/2019 |

*Primary Examiner* — Mohammad A Rahman
(74) *Attorney, Agent, or Firm* — Slater Matsil, LLP

(57) ABSTRACT

Semiconductor devices and methods of manufacture are provided wherein a metallization layer is located over a substrate, and a power grid line is located within the metallization layer. A signal pad is located within the metallization layer and the signal pad is surrounded by the power grid line. A signal external connection is electrically connected to the signal pad.

20 Claims, 7 Drawing Sheets

(52) U.S. Cl.
CPC ............... *H01L 2224/08135* (2013.01); *H01L 2224/08137* (2013.01); *H01L 2224/08145* (2013.01); *H01L 2224/08146* (2013.01); *H01L 2224/08147* (2013.01)

(58) Field of Classification Search
CPC ........... H01L 23/49838; H01L 21/4846; H01L 25/0657; H01L 23/525; H01L 2224/08135–08148; H01L 2224/0812–08123; H01L 2224/73103–73104; H01L 2224/73153; H01L 2224/73203–73209; H01L 2224/73253–73261; H01L 24/63; H01L 2224/63–70; H01L 2224/73217; H01L 2224/73223; H01L 2224/73231; H01L 2224/73259; H01L 2224/73267; H01L 2224/73273; H01L 2224/16155–16168; H01L 2224/16225–1624
See application file for complete search history.

(56) References Cited

U.S. PATENT DOCUMENTS

| | | | |
|---|---|---|---|
| 2005/0035468 A1* | 2/2005 | Andreini | H01L 24/05 257/786 |
| 2006/0220215 A1* | 10/2006 | Lee | H01L 27/1203 257/691 |
| 2010/0283130 A1* | 11/2010 | Nishio | H01L 21/76898 257/E21.597 |
| 2013/0043584 A1 | 2/2013 | Kwon et al. | |
| 2014/0347837 A1 | 11/2014 | Kariya et al. | |
| 2015/0068796 A1 | 3/2015 | Jung et al. | |
| 2015/0243611 A1 | 8/2015 | Liu et al. | |
| 2016/0155730 A1* | 6/2016 | Yu | H01L 21/0228 257/774 |
| 2016/0380324 A1 | 12/2016 | Wu et al. | |
| 2017/0005047 A1 | 1/2017 | Kawasaki et al. | |
| 2018/0174896 A1* | 6/2018 | Licausi | H01L 23/5283 |
| 2019/0164914 A1 | 5/2019 | Hu et al. | |
| 2020/0303361 A1* | 9/2020 | Shih | H01L 25/50 |
| 2020/0357770 A1 | 11/2020 | Chiang et al. | |

* cited by examiner

SEMICONDUCTOR DEVICE AND METHOD OF MANUFACTURE

PRIORITY CLAIM AND CROSS-REFERENCE

This application is a division of U.S. patent application Ser. No. 16/573,630, filed on Sep. 17, 2019, entitled "Semiconductor Device and Method of Manufacture," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as effective to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device. However, further improvements are desired in order to further reduce the size and improve the operating characteristics of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
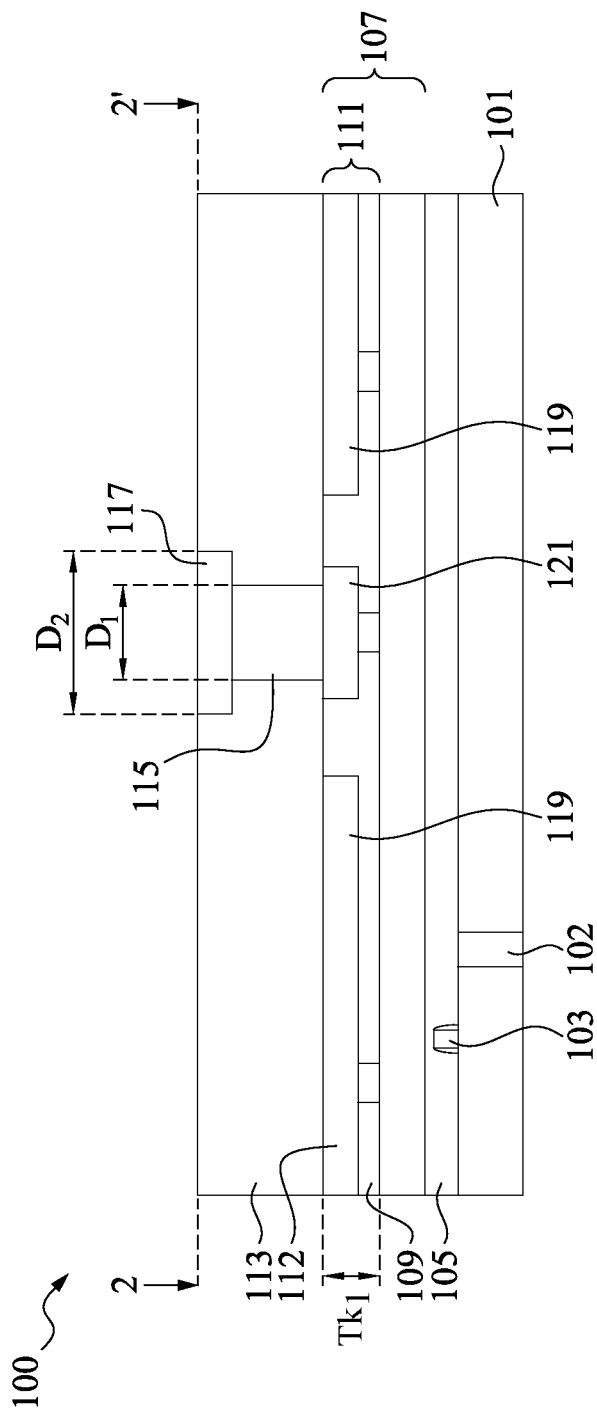
FIG. 1 illustrates a first semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to specific embodiments which incorporate the ideas into a three-dimensional integrated circuit (3DIC) structure. Embodiments are not, however, limited to the precise embodiments described herein, and may be incorporated into a wide variety of applications.

With reference now to FIG. 1, there is shown a first semiconductor device 100 with a substrate 101, through substrate vias (TSVs) 102 extending through the substrate 101, active devices 103 on the substrate 101, an interlayer dielectric (ILD) layer 105 over the active devices 103, and metallization layers 107 over the ILD layer 105. In an embodiment the first semiconductor device 100 may be part of a semiconductor wafer (not fully shown as a remainder of the semiconductor wafer extends away from the structure illustrated in FIG. 1), for example for a chip on wafer on substrate (CoWoS) embodiment. In other embodiments the first semiconductor device 100 may be separated from a semiconductor wafer, such as already being formed and singulated. Any suitable embodiment may be utilized.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the substrate 101 at this point in the process may be part of a semiconductor wafer (the full wafer of which is not illustrated in FIG. 1) that will be singulated in a later step.

Within the substrate 101, the TSVs 102 may be formed to extend through the substrate 101 so as to provide a quick passage of data signals from a first side of the substrate 101 to a second side of the substrate 101. In an embodiment the TSVs 102 may be formed by initially forming through silicon via (TSV) openings into the substrate 101. The TSV openings may be formed by applying and developing a suitable photoresist, and removing portions of the substrate 101 that are exposed to a desired depth. The TSV openings may be formed so as to extend into the substrate 101 to a depth greater than the eventual desired height of the substrate 101. Accordingly, while the depth is dependent upon the overall designs, the depth may be between about 20 μm and about 200 μm, such as a depth of about 50 μm.

Once the TSV openings have been formed within the substrate 101, the TSV openings may be lined with a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 μm and about 5 μm, such as about 1 μm.

Once the liner has been formed along the sidewalls and bottom of the TSV openings, a barrier layer may be formed and the remainder of the TSV openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer, filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used.

Once the TSV openings have been filled, a thinning of a second side of the substrate 101 is performed in order to expose the openings for the TSVs 102 and form the TSVs 102 from the conductive material that extends through the substrate 101. In an embodiment, the thinning of the second side of the substrate 101 may leave the TSVs 102 exposed. The thinning of the second side of the substrate 101 may be performed by a planarization process such as CMP or etching.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the first semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used. The ILD layer 105 may be formed using a process such as PECVD, although other processes, such as LPCVD, may be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as two layers, the metallization layers 107 are formed of alternating layers of dielectric and conductive material and may be formed through any suitable process (such as deposition, damascene, dual damascene, etc.). In an embodiment there may be thirteen layers of metallization separated from the substrate 101 by the ILD layer 105, but the precise number of metallization layers 107 is dependent upon the design of the first semiconductor device 100.

As part of the metallization layers 107, a top metal layer 111 is formed as a top most layer within the metallization layers 107. In an embodiment the top metal layer 111 is the thirteenth metallization layer and includes a dielectric layer 109 and conductive features 112 formed within the dielectric layer 109. The top metal layer 111 may be formed by initially depositing the dielectric layer 109 over a top surface of underlying layers of the metallization layers 107 (e.g., over the twelfth metallization layer of the metallization layers 107). The dielectric layer 109 may be deposited by chemical vapor deposition (CVD), physical vapor deposition (PVD), or the like. The dielectric layer may comprise a dielectric material such as silicon oxide, SiCOH, and the like, and may be formed to a first thickness $Tk_1$ of between about 2 μm and about 4 μm, such as about 3 μm. However, any suitable material, thickness and method of deposition may be utilized.

Once the dielectric layer 109 has been formed, the dielectric layer 109 may then be etched to form openings exposing a top surface of the underlying layers of the metallization layers 107. In an embodiment the dielectric layer 109 may be etched using, e.g., a via first dual damascene process, whereby a first masking and etching process is utilized to pattern and etch a via pattern at least partially into the dielectric layer 109. Once the via pattern is etched, a second masking and etching process is utilized to pattern and etch a trench pattern into the dielectric layer 109, wherein the etching of the trench pattern further extends the via pattern through the dielectric layer 109 to expose the underlying layer (e.g., the twelfth metallization layer of the metallization layers 107).

However, while a via first dual damascene structure is described, this is intended to merely be illustrative and is not intended to be limiting upon the embodiments. Rather, any suitable process or processes may be utilized to form the via openings and trench openings of the top metal layer 111. For example, a trench first dual damascene process, or even multiple single damascene processes, may be utilized. All such processes are fully intended to be included within the scope of the embodiments.

Once the via openings and trench openings have been formed, the conductive features 112 may be formed by depositing conductive material in the via openings and the trench openings using, for example, a plating process. In an embodiment the conductive features 112 may include conductive trenches and conductive vias connecting the conductive trenches to underlying structures (e.g., the twelfth metallization layer of the metallization layers 107). In an embodiment the conductive material may be copper, a copper alloy, aluminum, an aluminum alloy, combinations of these, or the like. However, any suitable material and any suitable process of formation may be utilized.

Once the via openings and trench openings have been filled and/or overfilled by the conductive material, the conductive features 112 may be formed by removing excess material from outside of the via openings and the trench openings. In an embodiment the removal may be performed using a planarization process such as a chemical mechanical polishing (CMP) process. However, any suitable removal process may be utilized.

In an embodiment the conductive features 112 formed within the dielectric layer 109 are formed to create multiple conductive structures within the top metal layer 111 which perform separate functions in the interconnection of the first semiconductor device 100 and a second semiconductor device 300 (not illustrated in FIG. 1 but illustrated and described further below with respect to FIG. 3). In one embodiment, the conductive features 112 will form both a power grid metal trace 119 along with a bond pad metallization 121 within the top metal layer 111. In an embodiment, the bond pad metallization 121 is utilized to help route electrical signals (not power and ground) from the underlying metallization layers 107 to an overlying bond pad metal trace 117 (described further below) so that the electrical signal can then be routed to or received from the second semiconductor device 300.

Additionally, the power grid metal trace 119 forms a portion of a power grid that will be utilized to supply power and ground connections between the first semiconductor device 100 and the second semiconductor device 300. By supplying power between the first semiconductor device 100 and the second semiconductor device 300, additional connections that are not routed through the 3DIC stack (e.g., the stack of the first semiconductor device 100, the second semiconductor device, and any other semiconductor devices within the stack) are not necessary and can be omitted. Such omissions can further reduce the surface area that the stack requires, thereby leading to a smaller overall device.

While the power grid metal traces 119 and the bond pad metallization 121 are illustrated, this is intended to be illustrative and is not intended to be limiting. Rather, any suitable number of other structures may also be located within the top metal layer 111 of the metallization layers 107. All such structures and combinations of structures may be utilized, and all such combinations are fully intended to be included within the scope of the embodiments.

However, by stacking the first semiconductor device 100 and the second semiconductor device 300 (or even stacking more semiconductor devices not separately illustrated), the overall power consumption is at least double (e.g., n times the number of semiconductor devices located within the stack) or more to a more traditional two dimensional design, thereby obviating the traditional two dimensional power grid design.

To take into account the increased power consumption, the power grid in some embodiments may arrange individual power grid metal traces 119 into a series of stripes located within the top metal layer 111. From a power grid standpoint, the individual stripes would ideally continually extend across the entire bonding surface of the first semiconductor device 100. However, the presence of the bond pad metallization 121 and the need to connect the bond pad metallization 121 to the bond pad metal trace 117 (used, e.g., to transmit signals to and from the second semiconductor device 300), prevents the ideal situation from being fully realized, as the introduction of the bond pad metallization 121 for signals will interrupt and break the power grid metal traces 119 into individualized segments with reduced lengths. If this is not handled appropriately (as further described below with respect to FIG. 2), the overall resistance for the power grid metal traces 119 will be increased and will lead to a higher IR drop in the overall power grid.

FIG. 1 additionally illustrates formation of a dielectric bond layer 113 over the metallization layers 107. The dielectric bond layer 113 may be used for fusion bonding (also referred to as oxide-to-oxide bonding) as part of a hybrid bond (described further below with respect to FIG. 3). In accordance with some embodiments, the dielectric bond layer 113 is formed of a silicon-containing dielectric material such as silicon oxide, silicon nitride, or the like. The dielectric bond layer 113 may be deposited using any suitable method, such as CVD, high-density plasma chemical vapor deposition (HDPCVD), PVD, atomic layer deposition (ALD), or the like, to a thickness of between about 0.65 μm and about 6 μm, such as about 5.5 μm. However, any suitable materials, deposition processes, and thicknesses may be utilized.

Once formed, the dielectric bond layer 113 may be planarized in order to provide a planar surface for further processing. In an embodiment the dielectric bond layer 113 may be planarized using a planarization process such as CMP. However, any other suitable planarization process may also be used.

Once the dielectric bond layer 113 has been formed, openings in the dielectric bond layer 113 are formed to expose conductive portions of the bond pad metallization 121 (as illustrated in FIG. 1) and the power grid metal traces 119 (not separately illustrated in FIG. 1) in preparation to form a bond pad via trace (BPVT) 115. In an embodiment a photoresist is applied over top surfaces of the dielectric bond layer 113 and the photoresist is then used along with one or more etches to etch the dielectric bond layer 113 in order to form the openings. The etches used to form the openings may include dry etching (e.g., RIE or NBE), wet etching, or the like. In accordance with some embodiments of the present disclosure, the etching stops on the metallization layers 107 such that the conductive portions of the bond pad metallizations 121 and the power grid metal traces 119 are exposed through the openings in the dielectric bond layer 113. However, any suitable processes may be utilized.

Second openings in the dielectric bond layer 113 are also utilized to widen portions of the openings in preparation for formation of a bond pad metal trace (BPMT) 117. In an embodiment another photoresist is applied over top surfaces of the dielectric bond layer 113. The photoresist is patterned and is then used to etch the dielectric bond layer 113 to form the second openings. The dielectric bond layer 113 may be etched by dry etching (e.g., RIE or NBE), wet etching, or the like.

Once the openings and the second openings have been formed within the dielectric bond layer 113, the openings and second openings may be filled with a seed layer and a plate metal to form the bond pad via trace 115 and the bond pad metal trace 117 (represented within FIG. 1 as being separate structure but which may or may not be physically separated in a final structure). The seed layer may be blanket deposited over top surfaces of the dielectric bond layer 113 and the exposed conductive portions of the bond pad metallizations 121 and the power grid metal traces 119 and sidewalls of the openings and the second openings. The seed layer may comprise a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material. A barrier layer (not separately illustrated) may be blanket deposited over top surfaces of the dielectric bond layer 113 and the exposed conductive portions of the bond pad metallizations 121 and the power grid metal traces 119 and sidewalls of the openings and the second openings before the seed layer. The barrier layer may comprise titanium, titanium nitride, tantalum, tantalum nitride, or the like.

Following the filling of the openings and the second openings, a planarization process, such as a CMP, is performed to remove excess portions of the seed layer and the plate metal, forming the bond pad via trace 115 and the bond pad metal trace 117. In some embodiments the bond pad via trace 115 is utilized to connect the bond pad metal trace 117 with the underlying bond pad metallization 121 and, through the underlying bond pad metallization 121, connect the bond pad metal trace 117 with the underlying metallization layers 107 as well as the active devices 103.

Additionally, the bond pad metal trace 117 is utilized to physically bond and electrically connect the first semiconductor device 100 to the overlying second semiconductor device 300 (not illustrated in FIG. 1 but illustrated and described further below with respect to FIG. 3). With the electrical connection between the bond pad metal trace 117 and the second semiconductor device 300, the bond pad metal trace 117 may be utilized to send and/or receive electrical signals between the first semiconductor device 100 and the second semiconductor device 300.

In an embodiment the bond pad via trace 115 may be sized as a via to transfer electrical signals between the bond pad metallization 121 and the bond pad metal trace 117 in order to facilitate the transfer of signals between the first semiconductor device 100 and the second semiconductor device 300. In some embodiments the bond pad via trace 115 may be shaped as a circle (in a top down view) with a diameter of a first distance $D_1$ of between about 1.25 μm and about 2.5 μm, such as about 1.8 μm. However, any suitable dimensions may be utilized.

Similarly, the bond pad metal trace 117 may be sized to not only facilitate the transfer of signals between the first semiconductor device 100 and the second semiconductor device 300 but also sized to facilitate a bonding of the first semiconductor device 100 to the second semiconductor device 300. In a particular embodiment the bond pad metal trace 117 may be shaped as a circle (in a top down view) with a diameter with a second distance $D_2$ of between about 1.5 μm and about 2.5 μm, such as about 2.5 μm. However, any suitable dimensions may be utilized.

Figure 2:
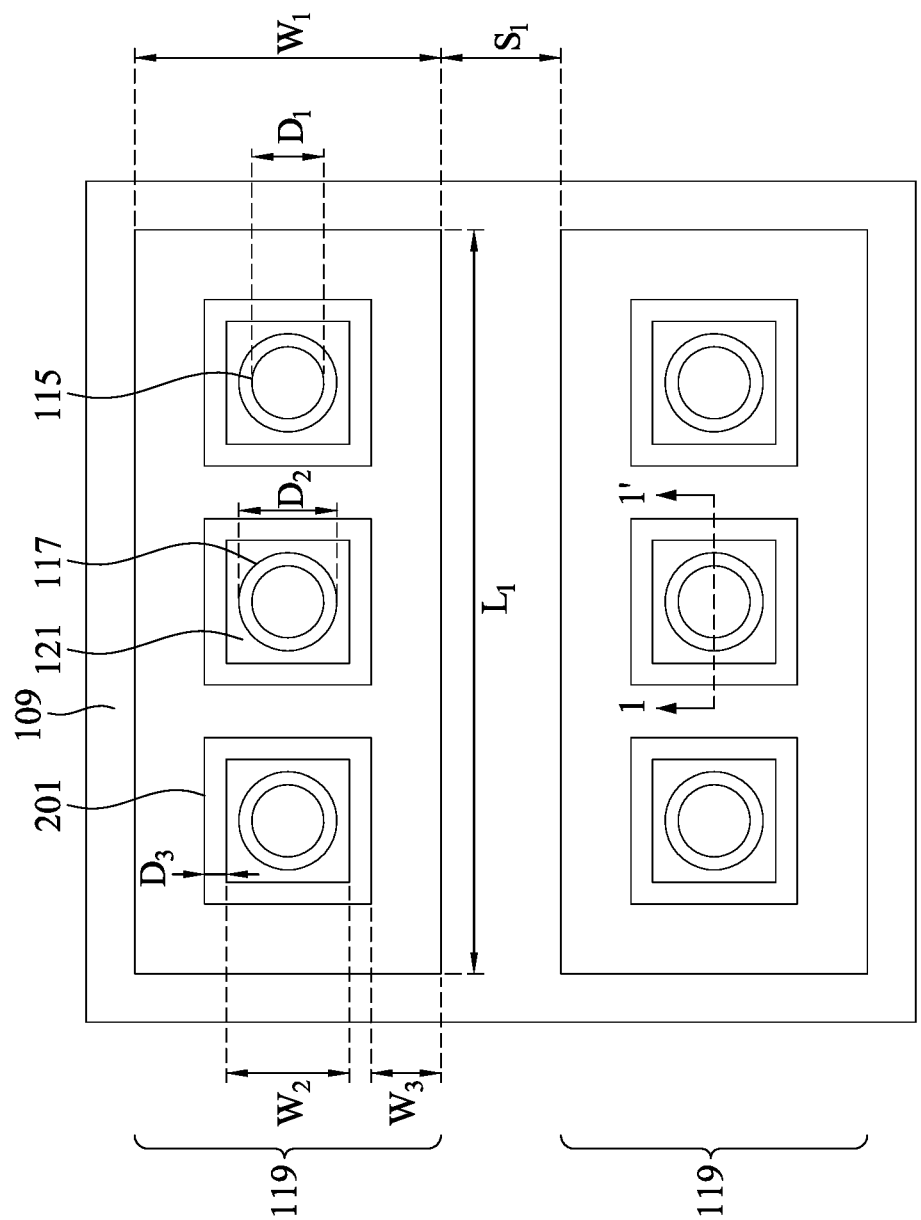
FIG. 2 a top down view of a power grid, in accordance with some embodiments.

FIG. 2 illustrates a top down of the first semiconductor device 100, with FIG. 1 being a cross sectional view of FIG. 2 along line 1-1' in FIG. 2 and FIG. 2 illustrates a top down view of FIG. 1 along line 2-2' (with the dielectric bond layer 113 removed from FIG. 2 for clarity). FIG. 2 illustrates two of the power grid metal traces 119 which are shaped into power grid strips which reduce the IR drop by incorporating holes 201 within the individual power grid metal traces 119. By incorporating the holes 201, the bond pad metal traces 117 for the signals may be located through the holes 201 within the power grid metal traces 119 without causing the power grid metal traces 119 to be segmented into different portions that are separated from each other. As such, without the power grid metal traces 119 being separated and segmented, the overall resistance of the power grid may be lowered and there will be less of an IR drop through the power grid.

In an embodiment the power grid metal traces 119 may comprise multiple parallel strips (e.g., multiple power grid metal traces 119 in parallel with each other). In a particular embodiment the power grid metal traces 119 are sized large enough to accommodate the holes 201 for the bond pad metal trace 117, the overlying bond pad via trace 115, and the overlying bond pad metallization 121. In an embodiment the power grid metal traces 119 are sized to have a first width $W_1$ that is as large as possible given the overall design of the first semiconductor device 100 as well as the minimum and maximum spacing provided by the particular technology nodes used to manufacture the first semiconductor device 100. As such, while the first width $W_1$ is at least in part dependent upon the technology node of the semiconductor manufacturing process, in one embodiment the first width $W_1$ may be between about 0.36 μm and about 10.8 μm, such as about 10.8 μm. However, any suitable width may be utilized.

Additionally, each of the power grid metal traces 119 have a first overlap length $L_1$ (a distance where one of the power grid metal traces 119 is directly adjacent to a second one of the power grid metal traces 119) that is equal to a length of the power grid metal traces 119 and wherein the length is sufficient to provide the desired routing of the power and ground. In the embodiment illustrated in FIG. 2 adjacent power grid metal traces 119 are formed to have the same length and are positioned such that the first overlap length $L_1$ may be about greater than 4.05 μm, such as about 50 μm, although the minimums will vary at least in part with different processing nodes and maximum lengths are dependent at least in part on the overall design and the amount of on chip area. Additionally, the adjacent power grid metal traces 119 have ends that are coterminous with each other such that the entire length of one of the power grid metal traces 119 overlaps an adjacent one of the power grid metal traces 119. However, any suitable length may be utilized.

In order to ensure a proper separation between the bond pad metallization 121 and the power grid metal traces 119, the bond pad metallization 121 may be separated from the power grid metal traces 119 (by, e.g., the dielectric layer 109) by a third distance $D_3$. In some embodiments the third distance $D_3$ is dependent at least in part upon the first width $W_1$ and the first overlap length $L_1$ of the power grid metal traces 119. In one embodiment, the third distance $D_3$ may be a fraction of the smaller of either the first width $W_1$ or the first overlap length $L_1$ as long as a first threshold has been reached, or may be a fraction of the first threshold itself. For example, the first fraction may be about one-third, while the first threshold may be between about 1.35 μm and about 4.05 μm, such as about 1.35 μm.

Additionally, in some embodiments multiple thresholds may also be utilized. For example, if both the first width $W_1$ and the first overlap length $L_1$ meet the first threshold, a second threshold higher than the first threshold may also be utilized. In such an embodiment, if both the first width $W_1$ and the first overlap length $L_1$ meet both the first threshold and the second threshold, then the third distance $D_3$ may be set at the first fraction of either the first width $W_1$, the first overlap length $L_1$, or the second threshold.

To illustrate these issues, in a particular embodiment in which the first threshold is the only threshold and is 1.35 μm, the third distance $D_3$ may be determined by first determining if both of the first overlap length $L_1$ and the first width $W_1$ are greater than the first threshold of 1.35 μm. If both are greater than the first threshold, than the third distance $D_3$ can be determined by multiplying the first threshold by the first fraction. In an embodiment in which the first fraction is one-third and the first threshold is 1.35 μm, the third distance $D_3$ may be 0.45 μm.

In another embodiment in which multiple thresholds are utilized, the first fraction may remain one-third while the first threshold may be set at 1.35 μm and the second threshold may be set at 4.05 μm. In this embodiment, if the first width $W_1$ and the first overlap length $L_1$ are both greater than the first threshold (e.g., are greater than 1.35 μm) and are also greater than the second threshold (e.g., are greater than 4.05 μm), then the third distance $D_3$ is set to one-third of the second threshold of 4.05 μm. As such, the third distance $D_3$ is at least 1.35 μm.

In yet another embodiment in which multiple thresholds are utilized, the first width $W_1$ and the first overlap length $L_1$ may be both greater than the first threshold, but one of which may be lower than the second threshold. In such an embodiment, the third distance $D_3$ may be set at the first fraction of the first threshold, not the second threshold, as the conditions for the second threshold have not been met.

Additionally, a first spacing $S_1$ separates a first one of the power grid metal traces 119 and a second one of the power grid metal traces 119. In an embodiment the first spacing $S_1$ may be determined following the pattern described above, and may be the same as the third distance $D_3$. For example, the first spacing $S_1$ may be determined by comparing the first width $W_1$ and the first overlap length $L_1$ to a first threshold (and, in some embodiments, a second threshold) and then determining the desired spacing using a fraction of the first threshold, the second threshold, the first width $W_1$, or the first overlap length $L_1$. However, any suitable spacing may be utilized.

In an embodiment, the bond pad metallization 121 may also have a second width $W_2$ of between about 0.36 μm and about 10.8 μm, such as about 1.96 μm. Similarly, the power grid metal trace 119 may have a third width $W_3$ that extends from the holes 201 to a sidewall of the power grid metal trace 119. In an embodiment the third width $W_3$ may be about 3.97 μm. However, any suitable widths may be utilized.

Figure 3:
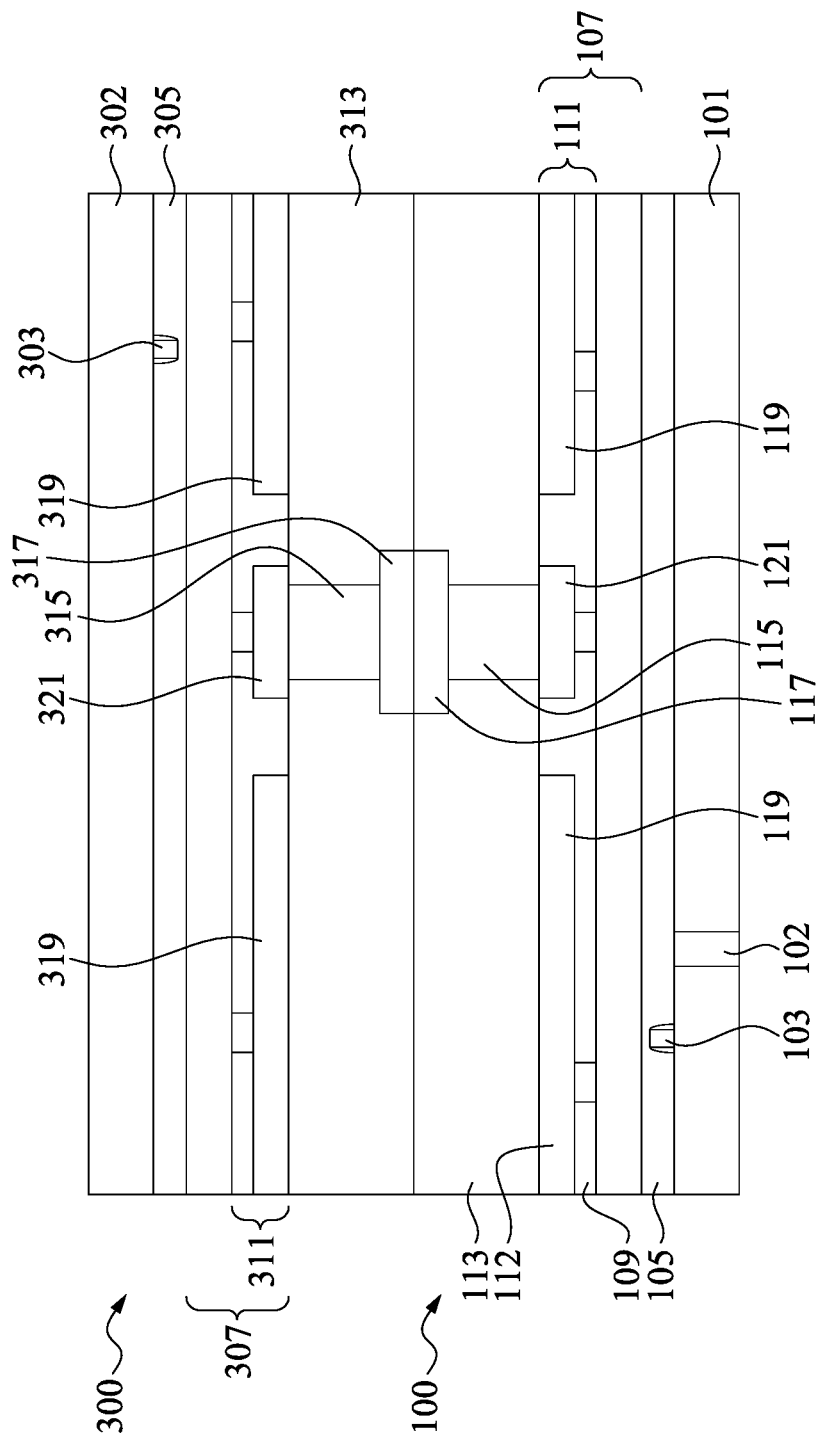
FIG. 3 illustrates a bonding of the first semiconductor device to a second semiconductor device, in accordance with some embodiments.

FIG. 3 illustrates a bonding of the first semiconductor device 100 to the second semiconductor device 300. In an embodiment the second semiconductor device 301 is a semiconductor device that is designed to be bonded to and functionally work with the first semiconductor device 100 in order to provide a desired function. In an embodiment in which the first semiconductor device 100 is, for example, a logic die, a central processing unit (CPU) die, a memory die (e.g., a DRAM die), combinations of these, or the like, the second semiconductor device 300 may be a device designed to work with and/or support the logic die, such as by being a memory device, a power die, a sensor die, combinations of these, or the like. However, any suitable combination of functionalities between the first semiconductor device 100 and the second semiconductor device 300 may be utilized.

In an embodiment the second semiconductor device 300 may have similar structures as the first semiconductor device 100. For example, the second semiconductor device 300 may comprise a second substrate 302 (similar to the substrate 101), second active devices 303 (similar to the active device 103), a second ILD layer 305 (similar to the ILD layer 105), second metallization layers 307 (similar to the metallization layers 107), a second top metal layer 311 (similar to the top metal layer 111), second power grid metal traces 319 (similar to the power grid metal traces 119), second bond pad via traces 315 (similar to the bond pad via traces 115), a second bond pad metallization 321 (similar to the bond pad metallization 121), second bond pad metal traces 317 (similar to the bond pad metal traces 117), and a second dielectric bond layer 313 (similar to the dielectric bond layer 113). However, any suitable structures may also be utilized.

In some embodiments, the first semiconductor device 100 is bonded to the second semiconductor device 300 by, for example, hybrid bonding. After the top surfaces of the first semiconductor device 100 and the second semiconductor device 300 are planarized, the top surfaces of the first semiconductor device 100 and the second semiconductor device 300 may be activated. Activating the top surfaces of first semiconductor device 100 and the second semiconductor device 300 may comprise a dry treatment, a wet treatment, a plasma treatment, exposure to an inert gas plasma, exposure to $H_2$, exposure to $N_2$, exposure to $O_2$, or combinations thereof, as examples. In embodiments where a wet treatment is used, an RCA cleaning may be used, for example. In another embodiment, the activation process may comprise other types of treatments. The activation process assists in the hybrid bonding of the first semiconductor device 100 and the second semiconductor device 300; advantageously allowing the use of lower pressures and temperatures in subsequent hybrid bonding processes.

After the activation process, the first semiconductor device 100 and the second semiconductor device 300 may be placed into contact. In a particular embodiment in which hybrid bonding is utilized, the bond pad metal trace 117 is placed into physical contact with the second bond pad metal trace 317 and the dielectric bond layer 113 is placed into physical contact with the second dielectric bond layer 313. With the activation process chemically modifying the surfaces, the bonding process between the materials is begun upon the physical contact.

Once physical contact has begun the bonding process, the bonding may then be strengthened by subjecting the assembly to a thermal treatment along with contact pressure. In an embodiment the first semiconductor device 100 and the second semiconductor device 300 may be subjected to a pressure of about 200 kPa or less, and a temperature between about 200° C. and about 400° C. to strengthen the bond between the dielectric bond layer 113 and the second dielectric bond layer 313. The first semiconductor device 100 and the second semiconductor device 300 may then be subjected to a temperature at or above the eutectic point for material of the bond pad metal traces 117, e.g., between about 150° C. and about 650° C., to fuse the bond pad metal trace 117 to the second bond pad metal trace 317. In this manner, fusion of the first semiconductor device 100 and the second semiconductor device 300 forms a hybrid bonded device.

Additionally, while specific processes have been described to initiate and strengthen the hybrid bonds between the first semiconductor device 100 and the second semiconductor device 300, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Additionally, while hybrid bonded has been described as one method of bonding the first semiconductor device 100 to the second semiconductor device 300, this as well is only intended to be illustrative and is not intended to be limiting upon the embodiments. Rather, any suitable method of bonding, such as fusion bonding, copper-to-copper bonding, or the like, or even solder bonding using, e.g., a ball grid array, may also be utilized. Any suitable method of bonding the first semiconductor device 100 to the second semiconductor device 300 may be utilized.

Finally, other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

During operation, the individual power grid metal traces 119 within the power grid may be connected to either power or ground. As such, the power grid may be utilized to supply power between the first semiconductor device 100 and the second semiconductor device 300. Similarly, the bond pad metallizations 121 may be connected to active devices or other structures such that electrical signals (that are not simply power or ground) can be transmitted between the first semiconductor device 100 and the second semiconductor device 300.

Figure 4:
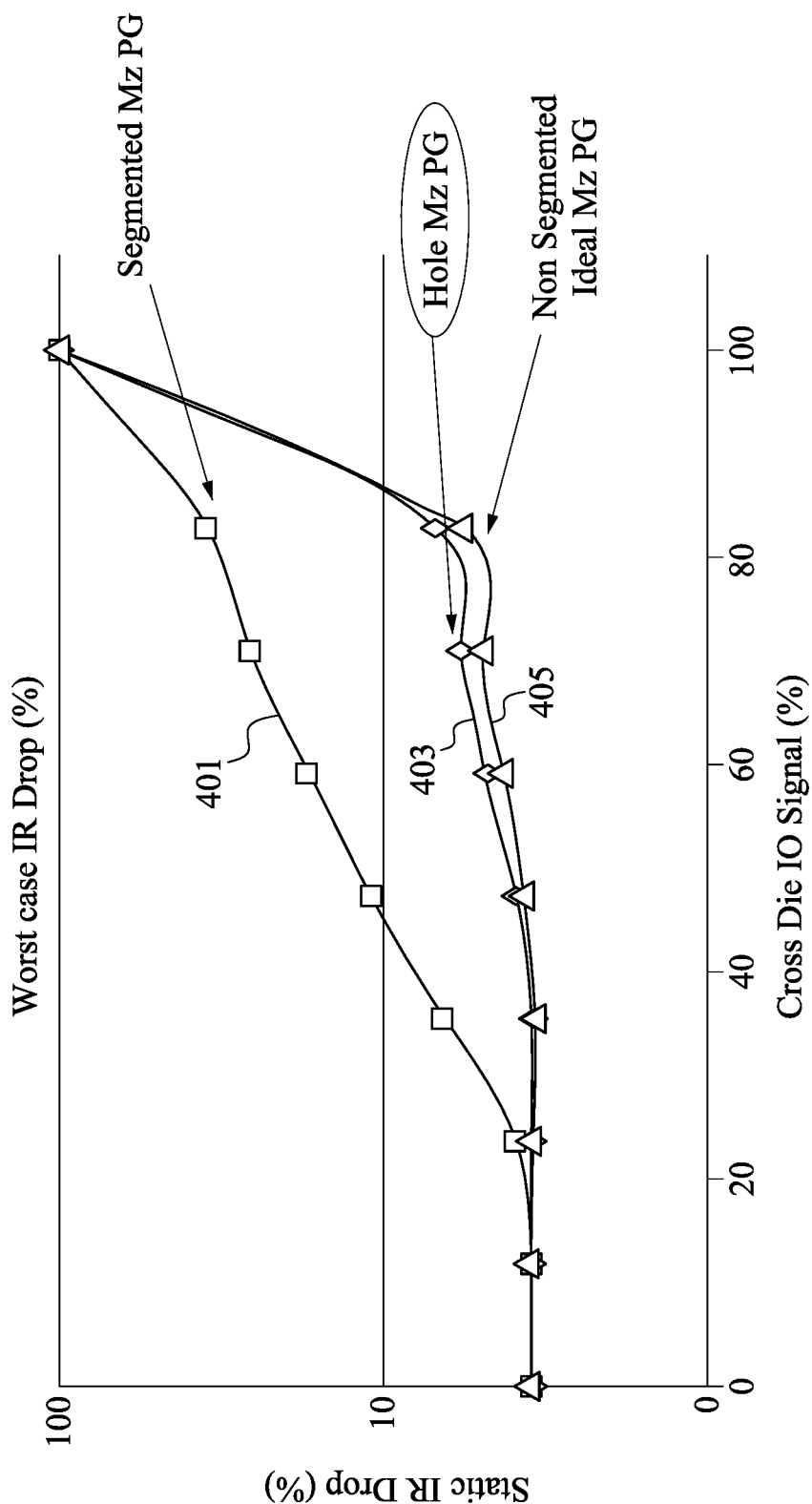
FIG. 4 illustrates improvements that can be achieved, in accordance with some embodiments.

FIG. 4 illustrates a comparison of IR drops that can be achieved by locating the bond pad metal traces 117 for the electrical signals through the power grid metal traces 119. In particular, illustrated in the chart are a y-axis which illustrates a percentage of a static IR drop while the x-axis illustrates a percentage of IO connections which are signals (as opposed to power/ground IO connections). As can be seen, in semiconductor devices which utilize power grid metal traces 119 that are heavily segmented (represented in FIG. 4 by the line labeled 401), there is a substantial increase in the worst case IR drop as more IO connections for signals are added (e.g., the line moves to the right along the x-axis) and the power grid metal traces 119 become segmented.

However, when the IO connections are located within the holes 201 of the power grid metal traces 119 (represented in FIG. 4 by the line labeled 403), there is a significant reduction in the static IR drop as additional IO connections for signals are added, and may be as large as an 80% IO signal net connection improvement. Additionally, the IR drop for this embodiment with the holes 201 are close to a fully realized, non-segmented ideal case scenario for IR drop, as represented by the line labeled 405. As such, by utilizing the holes 201 to avoid segmenting the power grid metal traces 119, the overall IR drop caused by the location of the IO connections can be minimized or even eliminated, thereby leading to an overall more efficient operation.

Figure 5:
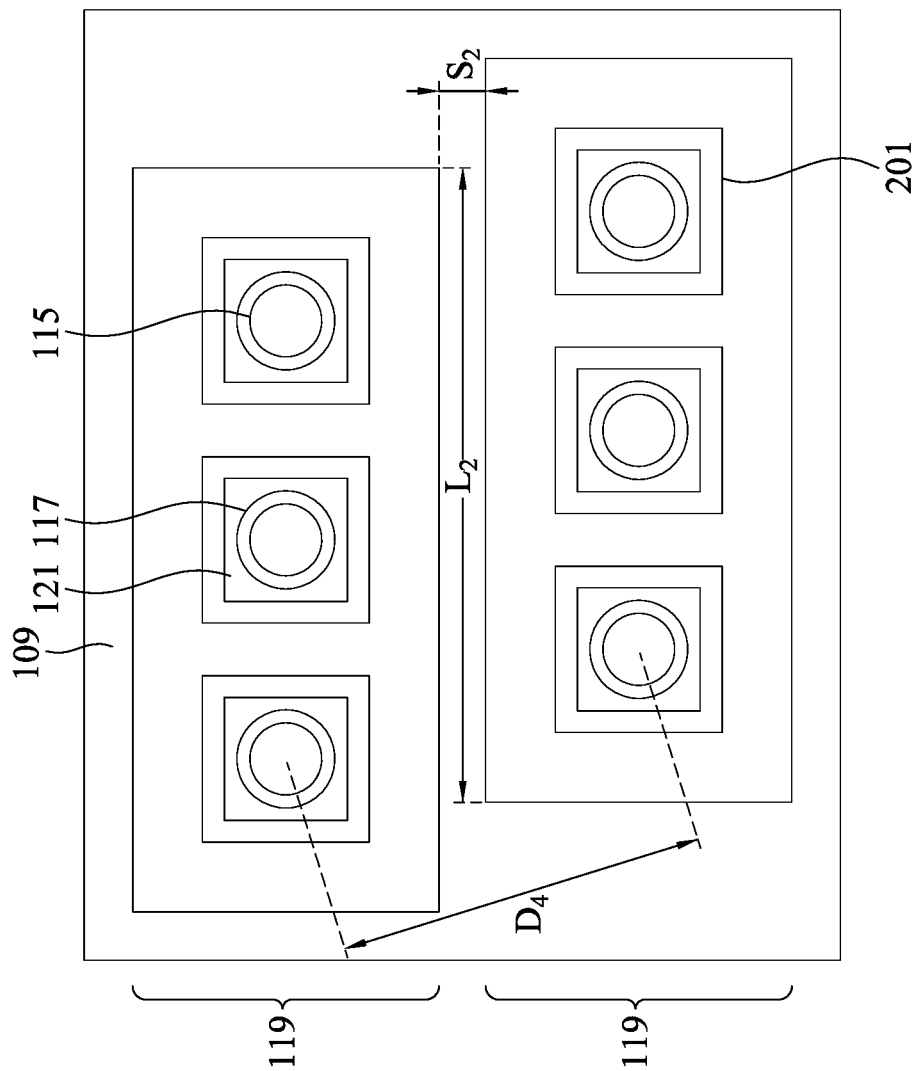
FIG. 5 illustrates offset power grid metal traces, in accordance with some embodiments.

FIG. 5 illustrates another embodiment which may be utilized in order to help reduce the spacing between the first one of the power grid metal traces 119 and the second one of the power grid metal traces 119 to a second spacing $S_2$. In this embodiment one of the power grid metal traces 119 is offset from an adjacent one of the power grid metal traces 119. By offsetting the first one of the power grid metal traces 119 and the second one of the power grid metal traces 119, a second overlap length $L_2$ between the first one of the power grid metal traces 119 and the second one of the power grid metal traces 119 (e.g., the distance where one of the power grid metal traces 119 and the second one of the power grid metal traces 119 are directly adjacent to each other) is reduced. By reducing this distance, the interference between the first one of the power grid metal traces 119 and the second one of the power grid metal traces 119 can be reduced.

Additionally, with respect to the second spacing $S_2$ being dependent upon the first width $W_1$ as well as the overlap distance (as described above with respect to FIG. 2), by offsetting the power grid metal traces 119, the second overlap length $L_2$ may be reduced without reducing the overall length of the first one of the power grid metal trace 119 or the second one of the power grid metal trace 119. By reducing the second overlap length $L_2$ without reducing the actual length, in an embodiment in which multiple thresholds are utilized (e.g., the first threshold and the second threshold), the second overlap length $L_2$ may drop below one of the thresholds (e.g., the second threshold), which allows the second spacing $S_2$ to be set at the first fraction of the first threshold (instead of being set at the first fraction of the second threshold). As such, the second spacing $S_2$ may be lowered, thereby allowing for a closer placement of the first one of the power grid metal trace 119 to the second one of the power grid metal trace 119. By placing the power grid metal traces 119 closer to each other, additional routing options are available, and more routing may be achieved in the same area.

In a specific embodiment the second overlap length $L_2$ may be reduced to a length which allows the second spacing $S_2$ (e.g., between the first one of the power grid metal traces 119 and the second one of the power grid metal traces 119) to be reduced. In some embodiments the overlap length $L_2$ may be reduced to be between about 1.35 μm and about 4.05 μm, such as about 3 μm. However, any suitable overlap spacing may be utilized.

By reducing the second overlap length $L_2$, the second spacing $S_2$ may also be reduced as there is less interference between the first one of the power grid metal traces 119 and the second one of the power grid metal traces 119. In some embodiments, the second spacing $S_2$ may be reduced (based in some embodiments upon the first threshold and the second threshold) to be between about 0.45 μm and about 1.35 μm, such as about 0.45 μm. However, any suitable spacing may be utilized.

In yet another embodiment illustrated in FIG. 5, in addition to the second overlap length $L_2$ being reduced by offsetting the first one of the power grid metal traces 119 from the second one of the power grid metal traces 119, the individual ones of the holes 201 within each of the power grid metal traces 119, while being aligned with each other in a first direction within their individual power grid metal traces 119, are offset or misaligned from the holes 201 within an adjacent one of the power grid metal traces 119. By offsetting the holes 201 in adjacent power grid metal traces 119, the distance between the bond pad via traces 115 in the adjacent power grid metal traces 119 are increased to a fourth distance $D_4$. In an embodiment the fourth distance $D_4$ may be between about 6 μm and about 50 μm, such as about 9 μm. However, any suitable distance may be utilized and may be dependent, at least in part, with the precise processing node being utilized.

By placing the bond pad metallizations 121 within the holes 201 of the lines of the power grid metal trace 119 such that the bond pad metallizations 121 are adjacent to at least two sides of the power grid metal trace 119, the bond pad metallizations 121 for the sending and receiving signals between semiconductor devices can be placed without the need of separating and segmenting the lines of the power grid metal traces 119. By keeping the power grid metal traces 119 continuous and non-segmented, the IR drop through the power grid metal traces 119 may be reduced. Additionally, by offsetting the power grid metal traces 119 and the holes 201 from each other, adjacent power grid metal traces 119 may be placed closer together, allowing for additional space savings to be achieved. All of these benefits allow for a smaller and more efficient device.

Figure 6A:
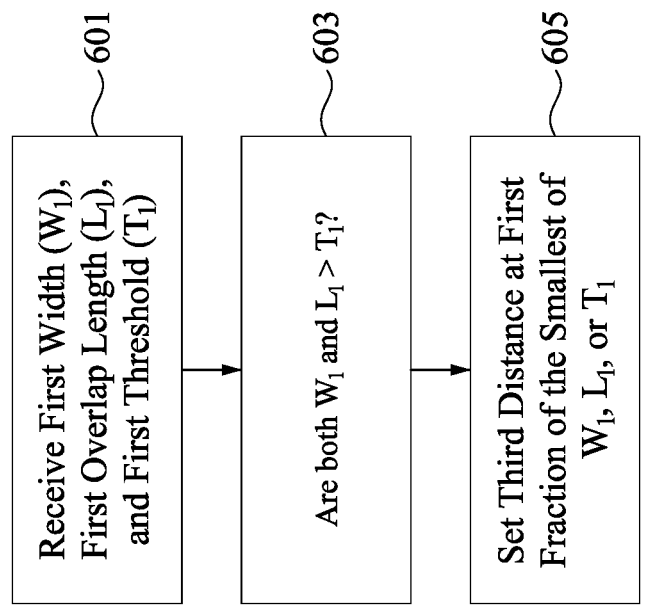
FIGS. 6A-6B illustrate flow charts in accordance with some embodiments.

FIG. 6A illustrates a flow chart to determine the third distance $D_3$ of an embodiment in which a first threshold is the only threshold utilized. In a first step 601 the first width $W_1$, the first overlap length $L_1$ and the first threshold $T_1$ are received. A determination is made in step 603 to see if both the first width $W_1$ and the first overlap length $L_1$ are greater than the first threshold $T_1$. If both the first width $W_1$ and the first overlap length $L_1$ are greater than the first threshold $T_1$, the third distance $D_3$ is set at the first fraction of the smallest of the first width $W_1$, the first overlap length $L_1$, or the first threshold $T_1$ in step 605. However, any suitable steps in any order may be utilized.

Figure 6B:
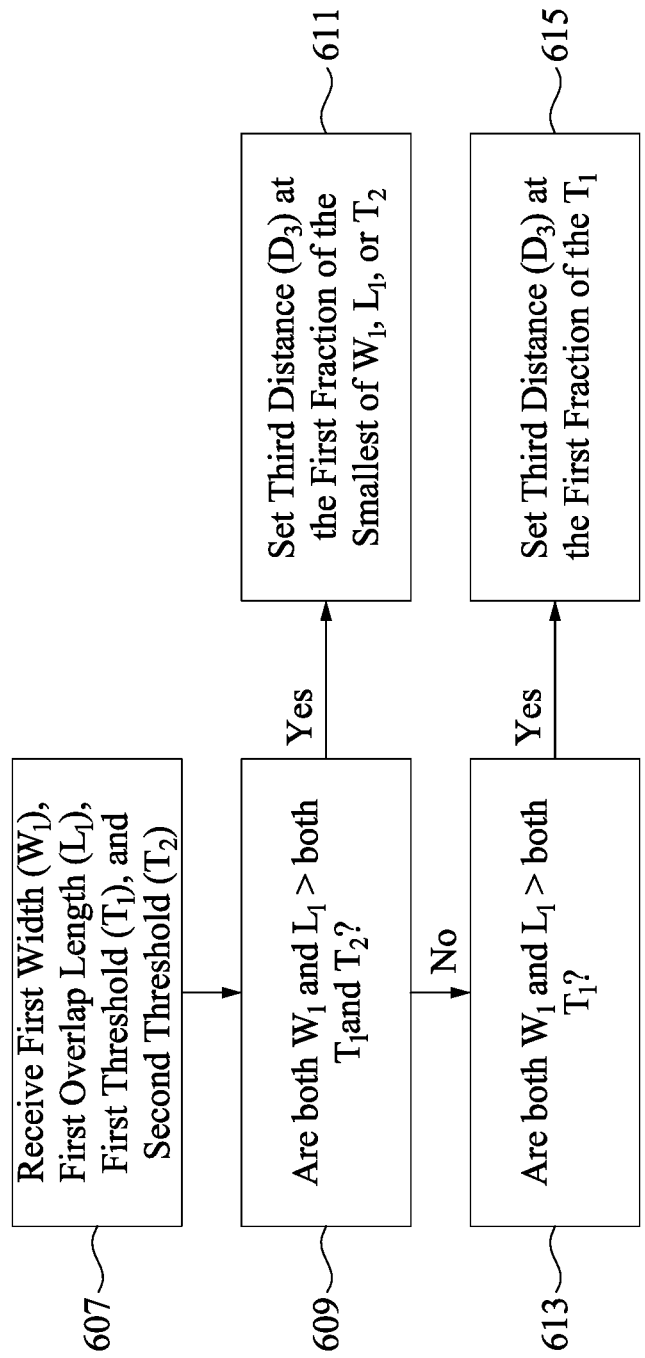

FIG. 6B illustrates another flow chart to determine the third distance $D_3$ of an embodiment in which the first threshold is utilized with a second threshold. In a first step 607 the first width $W_1$, the first overlap length $L_1$, the first threshold $T_1$ and the second threshold $T_2$ are received. In a second step 609 a determination is made to determine if both the first width $W_1$ and the first overlap length $L_1$ are greater than both the first threshold $T_1$ and the second threshold $T_2$. If the determination is yes, the third distance $D_3$ is set at the first fraction of the smallest of the first width $W_1$, the first overlap length $L_1$, and the second threshold $T_2$ in a third step 611. If the determination is no, then a determination is made in a fourth step 613 to see if both the first width $W_1$ and the first overlap length $L_1$ are greater than the first threshold $T_1$. If they are, then the third distance $D_3$ is set at the first fraction of the first threshold $T_1$. However, any suitable steps in any order may be utilized.

In accordance with an embodiment, a semiconductor device includes: a metallization layer over a substrate; a power grid line located within the metallization layer; a first signal pad located within the metallization layer and surrounded by the power grid line; and a signal external connection electrically connected to the first signal pad. In an embodiment, the semiconductor device further includes a bond pad via trace physically in contact with the first signal pad and the signal external connection. In an embodiment, the semiconductor device further includes a semiconductor device bonded to the signal external connection. In an embodiment, the semiconductor device is bonded with a hybrid bond. In an embodiment, the semiconductor device further includes a second signal pad located within the metallization layer and surrounded by the power grid line. In an embodiment, the first signal pad is separated from the power grid line by a dielectric material. In an embodiment, the dielectric material has a width of about 0.45 µm.

In accordance with another embodiment, a semiconductor device includes: an signal connection of a first semiconductor device; a via of the first semiconductor device physically in contact with both the signal connection and a first conductive portion of a metallization layer; and a power grid located within the metallization layer, wherein a first single line of the power grid surrounds the first conductive portion. In an embodiment the semiconductor device further includes: a second conductive portion of the metallization layer; a second single line of the power grid surrounding the second conductive portion, the second single line being different from the first single line; and a second via of the first semiconductor device physically in contact with both the second conductive portion of the metallization layer and a second external connection. In an embodiment the first conductive portion and the second conductive portion are aligned with each other. In an embodiment the first conductive portion and the second conductive portion are misaligned with each other. In an embodiment the first single line is separated from the second single line by a distance of about 0.45 µm. In an embodiment the first single line has a width of about 10.8 µm. In an embodiment the first conductive portion has a width of about 1.96 µm.

In accordance with yet another embodiment, a method of manufacturing a semiconductor device, the method includes: forming a first metallization layer over a first semiconductor substrate, the first metallization layer comprising a power grid with a first line and a signal connector, the first line having a first width in a first direction, the signal connector being adjacent to at least two sides of the first line, the signal connector having a second width less than the first width in the first direction; and forming a bond pad metal trace in electrical connection with the signal connector. In an embodiment the method further includes hybrid bonding a semiconductor die to the bond pad metal trace. In an embodiment the method further includes sending an electrical signal through the bond pad metal trace. In an embodiment the method further includes connecting the power grid to a power source. In an embodiment the first line surrounds the signal connector in a top down view. In an embodiment the first line is continuous from a first point adjacent to a first side of the signal connector to a second point adjacent to a second side of the signal connector opposite the first side of the signal connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a first dielectric layer over a semiconductor substrate;
   forming a first metallization layer within the first dielectric layer, the first metallization layer comprising a first line of a power grid surrounding completely on all sides a signal connector in a top down view, wherein the first line extends within a first plane, the first plane being parallel with a major surface of the semiconductor substrate;
   depositing a second dielectric layer to cover the first line and the signal connector; and
   forming a bond pad metal trace in the second dielectric layer and in electrical connection with the signal connector.

2. The method of claim 1, further comprising forming a bond pad metal via in the second dielectric layer and in electrical connection with the signal connector.

3. The method of claim 2, wherein the bond pad metal via has a diameter of between about 1.25 µm and about 2.5 µm.

4. The method of claim 3, wherein the bond pad metal trace has a diameter of between about 1.5 µm and about 2.5 µm.

5. The method of claim 1, wherein the first line has a width of between about 0.36 µm and about 10.8 µm.

6. The method of claim 1, wherein the first line has an overlap length greater than 4.05 µm, relative to a second line of the power grid adjacent to the first line.

7. The method of claim 1, wherein the first line is adjacent to a second line, and wherein the first line and the second line have ends that are coterminous with each other.

8. A method of manufacturing a semiconductor device, the method comprising:
   forming a first power line and a signal pad over a substrate, wherein the first power line is parallel with the substrate, and wherein after the forming the first power line, the signal pad is surrounded completely on all sides in a top down view by the first power line; and
   depositing a dielectric layer over the first power line and the signal pad;
   forming a via and a signal connector through the dielectric layer and in electrical connection with the signal pad.

9. The method of claim 8, further comprising forming a second power line adjacent to the first power line.

10. The method of claim 9, wherein the first power line is offset from the second power line.

11. The method of claim 10, wherein an overlap distance between the first power line and the second power line is between about 1.35 µm and about 3 µm.

12. The method of claim 11, wherein a spacing between the first power line and the second power line is between about 0.45 µm and about 1.35 µm.

13. The method of claim 8, wherein the signal connector has a diameter of between about 1.5 µm and about 2.5 µm.

14. The method of claim 8, wherein the via has a diameter of between about 1.25 µm and about 2.5 µm.

15. A method of manufacturing a semiconductor device, the method comprising:

forming a first metallization layer over and separated from a first semiconductor substrate, the first metallization layer comprising a power grid with a first line and a signal connector, the first line surrounding the signal connector completely on all side and having a first width in a first direction, the signal connector being adjacent to at least two sides of the first line, the signal connector having a second width less than the first width in the first direction;

depositing a dielectric layer over the first metallization layer; and forming a bond pad metal trace in the dielectric layer and in electrical connection with the signal connector.

16. The method of claim 15, further comprising hybrid bonding a semiconductor die to the bond pad metal trace.

17. The method of claim 15, further comprising sending an electrical signal through the bond pad metal trace.

18. The method of claim 17, further comprising connecting the power grid to a power source.

19. The method of claim 15, wherein the first line surrounds the signal connector in a top down view.

20. The method of claim 15, wherein the first line is continuous from a first point adjacent to a first side of the signal connector to a second point adjacent to a second side of the signal connector opposite the first side of the signal connector.

* * * * *